United States Patent
Joyce et al.

(10) Patent No.: US 7,831,887 B2
(45) Date of Patent: *Nov. 9, 2010

(54) METHOD AND APPARATUS FOR USING LONG FORWARD ERROR CORRECTING CODES IN A CONTENT DISTRIBUTION SYSTEM

(75) Inventors: Gerald R. Joyce, Newton, MA (US); John L. Moran, Millville, MA (US); Mark S. Schmidt, San Diego, CA (US)

(73) Assignee: General Instrument Corporation, Horsham, PA (US)

( * ) Notice: Subject to any disclaimer, the term of this patent is extended or adjusted under 35 U.S.C. 154(b) by 1011 days.

This patent is subject to a terminal disclaimer.

(21) Appl. No.: 11/300,905

(22) Filed: Dec. 15, 2005

(65) Prior Publication Data
US 2007/0143654 A1 Jun. 21, 2007

(51) Int. Cl.
*H03M 13/00* (2006.01)
(52) U.S. Cl. ............... 714/758; 714/804; 714/776
(58) Field of Classification Search ................ 714/758, 714/804
See application file for complete search history.

(56) References Cited
U.S. PATENT DOCUMENTS

| | | | |
|---|---|---|---|
| 6,298,462 B1 * | 10/2001 | Yi ........................ 714/784 |
| 6,314,289 B1 * | 11/2001 | Eberlein et al. ............. 455/427 |
| 6,523,147 B1 * | 2/2003 | Kroeger et al. ............. 714/792 |
| 6,704,370 B1 * | 3/2004 | Chheda et al. ............. 375/299 |
| 6,791,995 B1 * | 9/2004 | Azenkot et al. ............. 370/436 |
| 7,110,412 B2 * | 9/2006 | Costa et al. ............ 370/395.61 |
| 7,194,042 B2 * | 3/2007 | Walton et al. ............... 375/267 |
| 7,249,291 B2 * | 7/2007 | Rasmussen et al. ......... 714/701 |
| 7,555,696 B2 * | 6/2009 | Schmidt ..................... 714/758 |
| 2003/0226089 A1 * | 12/2003 | Rasmussen et al. ......... 714/758 |
| 2005/0157805 A1 * | 7/2005 | Walton et al. ............... 375/267 |
| 2005/0157806 A1 * | 7/2005 | Walton et al. ............... 375/267 |
| 2005/0175115 A1 * | 8/2005 | Walton et al. ............... 375/267 |
| 2007/0118787 A1 * | 5/2007 | Schmidt ..................... 714/752 |

* cited by examiner

*Primary Examiner*—M. Mujtaba K Chaudry
(74) *Attorney, Agent, or Firm*—Larry T. Cullen

(57) ABSTRACT

Method and apparatus for using long FEC codes in a content distribution system is described. One aspect of the invention relates to encoding frames of content. Each frame is partitioned into un-coded bits and bits to be encoded. For each frame, an FEC code is applied to the bits to be encoded to generate a codeword. Groups of bits from the codeword are divided among a plurality of channels. Symbols formed from the groups of bits and the un-coded bits are mapped to a constellation for each of the plurality of channels. The symbols are modulated across a respective plurality of bonded channels for transmission.

13 Claims, 3 Drawing Sheets

METHOD AND APPARATUS FOR USING LONG FORWARD ERROR CORRECTING CODES IN A CONTENT DISTRIBUTION SYSTEM

BACKGROUND OF THE INVENTION

1. Field of the Invention

The present invention relates to content delivery systems and, more particularly, to a method and apparatus for using long forward error correction (FEC) codes in a content distribution system.

2. Description of the Background Art

The demand for broadband content by business and residential subscribers is continually increasing. Broadband content includes multiple types of communications and data, such as broadcast television channels, video-on-demand, streaming video, multimedia data, Internet access, packet telephony, etc. To meet the increasing demand, it is typically necessary to increase throughput to each subscriber and improve overall quality of service. Current delivery technologies include several variations of digital subscriber line (DSL) technology, which uses telephony facilities, and cable modem systems using cable television facilities and hybrid fiber coaxial (HFC) distribution networks.

Delivery of data services over cable television systems is typically compliant with the Data-over-cable-service-interface-specifications (DOCSIS) standard. The content is typically modulated using quadrature amplitude modulation (QAM). Current cable QAM standards use conventional forward error correction (FEC) techniques to transmit the data downstream. FEC is a system of error control for data transmission where the receiving device has the capability to detect and correct fewer than a predetermined number or fraction of bits or symbols corrupted by transmission errors. FEC is accomplished by adding redundancy to the transmitted information using a predetermined algorithm. The original information may or may not appear in the encoded output; codes that include the un-modified input in the output are systematic, while those that do not are nonsystematic.

It is desirable to improve the sensitivity of QAM transmission within a cable delivery system by using long FEC codes. For example, a low density parity check (LDPC) code can improve the sensitivity of 256-QAM or 1024-QAM by more than 2 dB. However, the use of such long codes results in considerable latency in the transmission path. Accordingly, there exists a need in the art for a method and apparatus for improved FEC in a content distribution system.

SUMMARY OF THE INVENTION

Method and apparatus for using long FEC codes in a content distribution system is described. One aspect of the invention relates to encoding frames of content. Each frame is partitioned into un-coded bits and bits to be encoded. For each frame, an FEC code is applied to the bits to be encoded to generate a codeword. Groups of bits from the codeword are divided among a plurality of channels. Symbols formed from the groups of bits and the un-coded bits are mapped to a constellation for each of the plurality of channels. The symbols are modulated across a respective plurality of bonded channels for transmission.

BRIEF DESCRIPTION OF DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION OF THE INVENTION

Method and apparatus for using long forward error correction (FEC) codes in a content distribution system is described. One or more aspects of the invention relate to multiplexing low density parity check (LDPC) codes across multiple bonded channels in a quadrature amplitude modulation (QAM) transmission system. While the use of LDPC codes over a QAM transmission link is described as an example, those skilled in the art will appreciate that the invention may be adapted for use with other types of long FEC codes, such as blocked convolutional codes, Turbo codes, and Turbo Product Codes, with other types of modulation, M-ary Phase Shift Keying (MPSK) and Orthogonal Frequency Division Multiplexing (OFDM).

Figure 1:
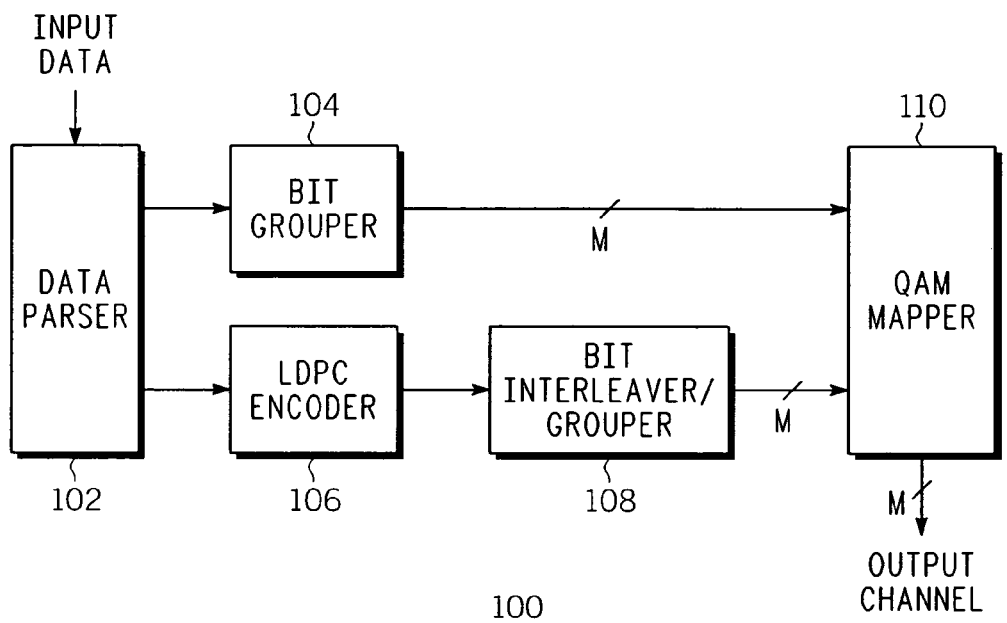
FIG. 1 is a block diagram depicting an exemplary embodiment of an encoder constructed in accordance with one or more aspects of the invention.

FIG. 1 is a block diagram depicting an exemplary embodiment of an encoder 100 constructed in accordance with one or more aspects of the invention. The encoder 100 includes a data parser 102, a bit grouper 104, an LDPC encoder 106, a bit interleaver/grouper 108, and a QAM mapper 110. The encoder 100 is configured to process frames of information bits to produce m symbol streams, where m is greater than one. The m symbol streams may be modulated for transmission across m bonded channels. In one embodiment, the encoder 100 produces four symbols streams to be modulated and transmitted across m=4 bonded channels.

The encoder 100 is configured to apply an LDPC code to QAM symbols at a rate of n bits per symbol. That is, n least significant bits (LSBs) of each symbol are encoded. The $[\log_2(M)-2]$ most significant bits (MSBs) for each M-QAM symbol are un-coded bits from the input data. For purposes of clarity by example, the encoder 100 is described below as using a systematic rate ⅚ LDPC code of length N=32,400 bits with n=2 encoded bits per symbol. It is to be understood that such parameters are merely exemplary and that the encoder 100 may employ an LDPC code having a different rate, having a different length, and/or being applied to a different number of bits per symbol. LDPC codes are described briefly below.

An LDPC code is defined by its sparse parity check matrix, H, of dimension (N−K)×N, which can be viewed as connections between nodes in a bipartite (or two sided) graph. A regular (λ, ρ) code has λ ones in each column, and ρ ones in each row of H. The variable λ is the column, bit, or variable node degree, while the variable ρ is the row or check node degree. The rate of a regular LDPC code is R=K/N=(1−λ/ρ). An irregular LDPC code has varying values of λ and ρ for different columns and rows, respectively. A codeword vector, $c^T$, of N bits must satisfy the parity check constraints $Hc^T=0$. A randomly selected graph will yield a good code with high probability. This is consistent with Shannon's random coding theorem that finds long random codes yield good performance. That said, it is not desirable to choose a graph of low girth, i.e., short cycles of length 4 should be avoided. A cycle length of 4 occurs when two bit nodes and two check nodes are interconnected by 4 edges. In terms of the H matrix, no two rows should have 1's in more than one column location. Encoding of block codes is generally done using a K×N code generator matrix, G, that satisfies $GH^T=0$. A length K-bit information vector, u, forms the codeword through the matrix multiplication, c=uG. This encoding operation requires $O(N^2)$ operations (quadratic in time) and further requires the generation of G from the sparse random H.

Better code performance can be achieved using an irregular LDPC code. An irregular LDPC code is described by node degree distribution polynomials, λ(x) for bit (variable) nodes and ρ(x) for check nodes, where $$\lambda(x) = \sum_{i=2}^{d_v} \lambda_i x^{i-1} \text{ and} \qquad \text{Eq. 1}$$

$$\rho(x) = \sum_{i=2}^{d_c} \rho_i x^{i-1}. \qquad \text{Eq. 2}$$

In Equations 1 and 2, $\lambda_i$ and $\rho_i$ are the fractions of graph edges connected to bit and check nodes, respectively, that have degree i; $d_v$ and $d_c$ represent the maximum variable and check node degrees in the graph. Generally, for linearly independent check equations, the design rate of the irregular code is:

$$R = 1 - \frac{\int_0^1 \rho(x)dx}{\int_0^1 \lambda(x)dx} \qquad \text{Eq. 3}$$

and the number of bit/variable nodes of degree i is the integer part of:

$$N_v(i) = \frac{N\lambda_i}{i\int_0^1 \lambda(x)dx} \qquad \text{Eq. 4}$$

while the number of check nodes of degree i is:

$$N_c(i) = \frac{N\rho_i}{i\int_0^1 \rho(x)dx}. \qquad \text{Eq. 5}$$

Linear-time encoding for a systematic code can be done by using a "staircase" matrix for the parity bit calculations. The staircase matrix has the form:

$$H = [H_1 H_2] \qquad \text{Eq. 6}$$

$$H_2 = \begin{bmatrix} 1 & & & & & \\ 1 & 1 & & & & \\ & 1 & 1 & & & \\ & & & \cdots & & \\ & & & & 1 & 1 \\ & & & & & 1 & 1 \end{bmatrix},$$

where $H_2$ is an (N−K)×(N−K) matrix that allows recursive parity bit calculation from the K-systematic codeword bits using the systematic bits specified by rows in the (N−K)×K $H_1$ matrix. Note that all non-"1" entries in the $H_2$ matrix above are zero. For a more detailed explanation of irregular code design, the reader is referred to M. Yang et al., "Design of Efficiently Encodable Moderate-Length High-Rate Irregular LDPC Codes," IEEE Trans. Commun., vol. 52, pp. 564-571, April 2004.

Returning to FIG. 1, the data parser 102 is configured to receive the frames of information bits. The data parser 102 parses each frame of information bits into un-coded bits and bits to be encoded using set partitioning. The data parser 102 provides the un-coded bits to the bit grouper 104, and the bits to be encoded to the LDPC encoder 106. In the present example, the LDPC encoder 106 is configured to apply a rate 5/6 LDPC code of length N=32,400. As such, the data parser 102 produces K=27,000 bits to be encoded for each frame (R=K/N). Since the length N=32,400 LDPC code is applied at a rate of n=2 bits per symbol, the encoder 100 produces 16,200 symbols per frame. As such, the data parser 102 produces 16,200×[log₂(M)−2] un-coded bits per frame for M-QAM (e.g., 97,200 un-coded bits and 129,600 un-coded bits per frame for 256- and 1024-QAM, respectively). The frame bit-length, number of un-coded bits, number of bits to be encoded, and number of symbols per frame depend on the rate (R) and length (N) of the LDPC code, the rate (n) at which the LDPC code is applied per symbol, and the number (M) of points in the QAM constellation. As such, these values are merely exemplary.

The LDPC encoder 106 processes the bits to be encoded for each frame to produce a codeword for each frame using the configured LDPC code. In the present example, the LDPC encoder 106 produces a length N=32,400 bit codeword for each frame having 27,000 information bits and 5400 parity bits. The bit interleaver/grouper 108 interleaves the bits to form an interleaved stream of bits using any type of bit-interleaving technique known in the art (e.g., block interleaving or non-uniform interleaving). The interleaved bits are grouped to produce groups of n bits. Each group of n bits will be mapped to the LSBs of a QAM symbol. In the present example, groups of n=2 bits are formed from the interleaved bits of the codeword for each frame. The bit interleaver/grouper 108 divides the bit groups among m output streams for each frame. In the present example, the bit interleaver/grouper 108 collectively produces 16,200 2-bit groups per frame, which are divided into 4050 2-bit groups for each of the m=4 streams. In one embodiment, the bit groups are divided among the m streams in a round-robin fashion. Thus, in the present example, a first stream includes the $1^{st}$, $5^{th}$, $9^{th}$, etc. bit groups, the second stream includes the $2^{nd}$, $6^{th}$, $10^{th}$, etc. bit groups, the third stream includes the $3^{rd}$, $7^{th}$, $11^{th}$, etc.

bit groups, and the fourth stream includes the $4_{th}$, $8^{th}$, $12^{th}$, etc. bit groups. Alternatively, the first stream may include the first 4050 bit groups, the second stream may include the second 4050 bit groups, and so on. This alternative scheme may be used with an outer code and convolutional symbol interleaving scheme that corrects bursts of errors occurring in consecutive QAM symbols on a given QAM carrier. The output of the bit interleaver/grouper 108 is provided to the QAM mapper 110.

The bit grouper 104 processes the un-coded bits for each frame to produce bit groups that will be mapped to MSBs of the QAM symbols. The bit groups are divided among m streams. In the present example, the bit grouper 104 produces 16,200 bit groups, where each bit group includes $\log_2(M)-2$ bits for M-QAM (e.g., 6 bits per group for 256-QAM and 8 bits per group for 1024-QAM). The 16,200 bit groups are divided among m=4 output streams using the same scheme employed by the bit interleaver/grouper 108 (e.g., round robin). The output of the bit grouper 104 is provided to the QAM mapper 110.

The QAM mapper 110 combines the bit groups from the bit grouper 104 with the bit groups from the bit interleaver/grouper 108 to form symbols on each of the m channels (e.g., 4050 symbols for each of m=4 channels). For each symbol, a bit group from the bit grouper 104 is mapped to the MSBs of the QAM constellation point and a bit group from the bit interleaver/grouper 108 is mapped to the LSBs of the QAM constellation point. The QAM mapper 110 maps the symbols in each channel onto an M-QAM constellation. The QAM mapper 110 produces m streams of QAM symbols as output for modulation across m bonded channels.

By multiplexing an LDPC code across multiple bonded channels, latency due to the length of the code is reduced. In an encoder operating at 5.36 Mega-symbols per second (Msymbols/sec), mapping a sequence of 4050 bit pairs into each of four channels requires only 0.75 milliseconds of latency. At the receiver end, the code requires another 0.75 milliseconds of receive time to received as a block. Thus, a 1.5 millisecond total latency is added to the QAM link. In contrast, if a single un-bonded channel is used, mapping a sequence of 16,200 bit pairs onto the channel requires 3 milliseconds at 5.36 Msymbols/sec. The receiver will require another 3 milliseconds of receive time yielding a total latency of 6 milliseconds. Thus, the invention reduces the latency by a factor of m (e.g., a factor of 4).

Figure 2:
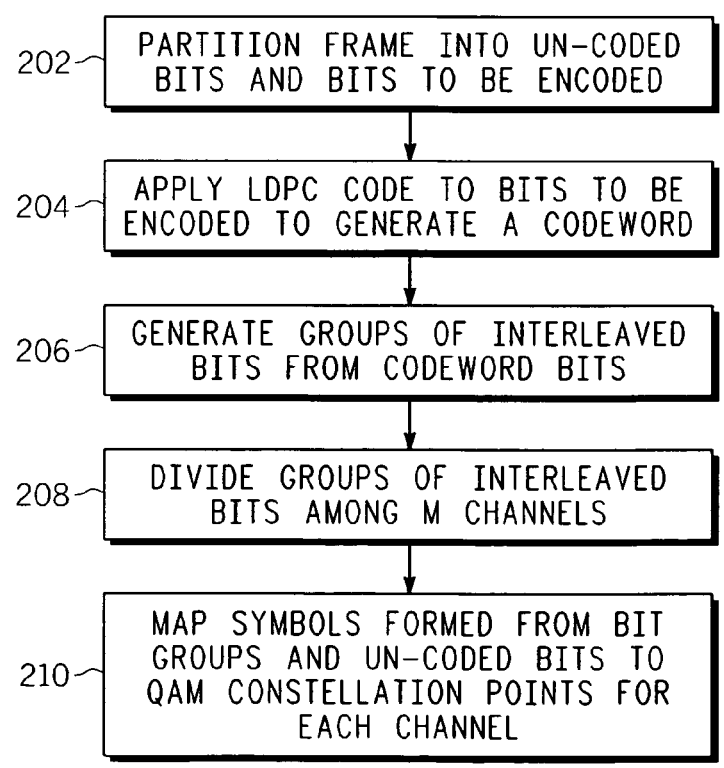
FIG. 2 is a flow diagram depicting an exemplary embodiment of a method for encoding frames of information in accordance with one or more aspects of the invention.

FIG. 2 is a flow diagram depicting an exemplary embodiment of a method 200 for encoding frames of information in accordance with one or more aspects of the invention. The method 200 begins at step 202, where a frame of input bits is partitioned into un-coded bits and bits to be encoded. At step 204, an LDPC code is applied to the bits to be encoded to generate a codeword having information bits and parity bits. At step 206, groups of interleaved bits are generated from the codeword bits. At step 208, the groups of interleaved bits are divided among m streams. At step 210, the symbols formed from the bit groups and groups of un-coded bits are mapped to points in a QAM constellation for each of m channels. The method 200 is repeated for each frame.

Figure 3:
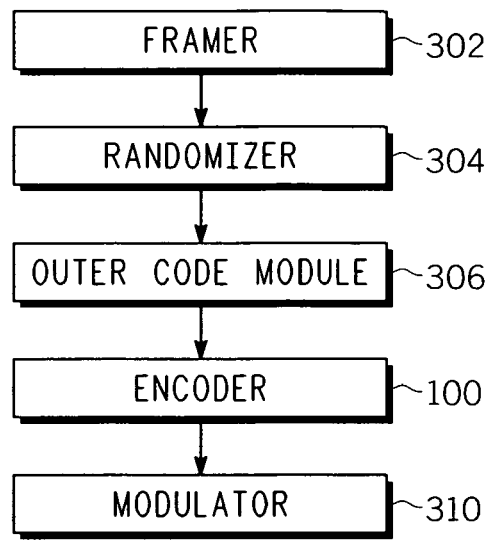
FIG. 3 is a block diagram depicting an exemplary embodiment of a content encoding system constructed in accordance with one or more aspects of the invention.

FIG. 3 is a block diagram depicting an exemplary embodiment of a content encoding system 300 constructed in accordance with one or more aspects of the invention. The content encoding system 300 employs the encoder 100 of FIG. 1. The encoding system 300 includes a framer 302, a randomizer 304, an outer code module 306, and a modulator 310. The encoding system 300 is configured to process one or more content streams to produce a modulated data for transmission over m bonded channels towards one or more decoders. For example, the encoding system 300 may be used to encode content for downstream transmission towards a modem in a data-over-cable service interface specification (DOCSIS) architecture.

For purposes of clarity by example, the input content is described as one or more MPEG-2 (moving picture experts group, version 2) transport streams. Notably, an MPEG-2 transport stream (TS) includes a sequence of 188-byte packets, as is well known in the art. It is to be understood that the encoding system 300 may be configured to process other types of content streams known in the art. Briefly stated, the encoding system 300 is configured to frame the TS packets for outer coding, randomize the bits (exclusive of the MPEG sync byte), apply an outer code, and then apply inner low density parity check (LDPC) coding, interleaving, and quadrature amplitude modulation (QAM) symbol matching.

In particular, the input TS packets are processed by the framer 302, the randomizer 304, and the outer code module 306 to allow carriage and synchronization of the transport stream(s) at the decoder. The framer 302 processes the input TS packets to produce superframes of TS packets. Continuing with the example used above in FIG. 1, a superframe includes 550 or 700 TS packets for operation in 256- or 1024-QAM modes, respectively. A superframe includes seven inner LPDC coded QAM symbol frames of data. For each superframe, the randomizer 304 randomizes the bits in each TS packet exclusive of the MPEG-2 0x47 sync byte (i.e., 187 bytes). For example, the randomizer may employ a pseudo-noise (PN) shift register sequence generator, as is well known in the art.

In one embodiment, the outer code module 306 applies a block code to the TS packets output from the randomizer 304. In one embodiment, the outer code module 306 applies a Reed-Solomon (RS) block code. For example, the outer code module 306 may apply an (n, k)=(189, 187), t=1 byte-error correcting RS code over GF(256) to each 187-byte TS packet (the sync byte is excluded). That is, the outer code module 306 produces 189-byte code words having two parity bytes such that a bit error occurring within any single byte of a code word at the decoder can be corrected. Those skilled in the art will appreciate that other types of outer codes may be employed.

The output of the outer code module 306 is processed by the encoder 100, which is described above with respect to FIG. 1. The encoder 100 produces m symbol streams, which are coupled to the modulator 310. The modulator 310 modulates the m symbol streams across m bonded channels in a well-known manner for transmission towards one or more decoders.

Figure 4:
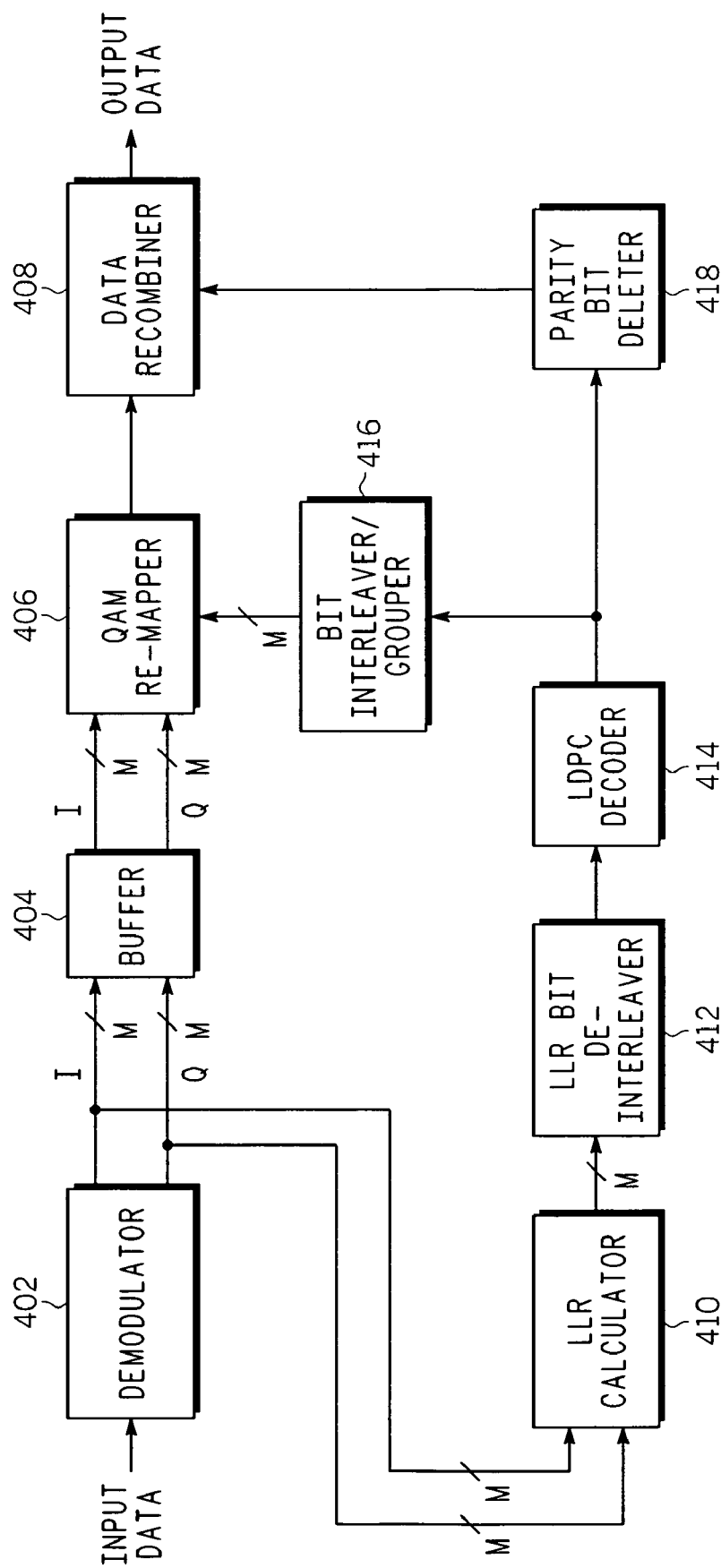
FIG. 4 is a block diagram depicting an exemplary embodiment of a decoder for decoding the modulated output of the content encoding system of FIG. 3 constructed in accordance with one or more aspects of the invention.

FIG. 4 is a block diagram depicting an exemplary embodiment of a decoder 400 for decoding the modulated output of the content encoding system 300 of FIG. 3 constructed in accordance with one or more aspects of the invention. The decoder 400 is described below in accordance with the examples of FIG. 1 and FIG. 3. The decoder 400 includes a demodulator 402, a buffer 404, a QAM re-mapper 406, a data re-combiner 408, a log-likelihood ratio (LLR) calculator 410, an LLR bit de-interleaver 412, an LDPC decoder 414, a bit-interleaver/grouper 416, and a parity bit deletion module 418. The demodulator 402 receives the modulated data from the encoding system 300. The demodulator 402 demodulates the data using well-known QAM demodulation techniques to produce 4050 in-phase and quadrature (I and Q) values per frame for each of the m=4 bonded channels. That is, there is one I, Q pair of values per symbol per channel in the frame. The I, Q pairs produced by the demodulator 402 are stored in the buffer 404 and are provided to the LLR calculator 410.

The LLR calculator 410 computes an LLR from the received I and Q sample values for each channel. A soft-decision is required for each of the 2 LSB bits in the M-QAM symbol. The LLR calculator 410 may apply a simplified max{ log p(y|x)} algorithm, as described in G. Caire et al., "Bit-Interleaved Coded Modulation," IEEE Trans. Inform. Theory, vol. 44, pp. 927-946, May 1998. Notably, constellation points are grouped into subsets $\chi_b^i$, which are the sets of points that have value b∈{0,1} for the ith bit location in the QAM symbol. Likelihood metrics $$\lambda^i(y,b) = \max\{ \log p(y|x)\} \quad \text{Eq. 7}$$

are calculated for the received point, y, and each possible least significant bit (LSB) location i=0, 1 for b∈{0, 1}, where the maximum is over all x∈$\chi_b^i$. For the AWGN channel, maximization of the logarithm of the transition probability is equivalent to minimizing the Euclidean distance. The final LDPC decoder input LLR for each LSB is given by:

$$LLR^i = \lambda^i(y,1) - \lambda^i(y,0) \quad \text{Eq. 8}$$

The LLR calculator 410 produces 8100 LLRs per frame per channel. The LLRs are multi-level values. The LLR bit de-interleaver 412 de-interleaves the LLRs produced by the LLR calculator 410. The LLR bit de-interleaver 412 produces a single stream of LLRs from the four channels. The LDPC decoder 414 decodes the output of the LLR bit de-interleaver 412. In one embodiment, the LDPC decoder 414 implements a quantized, message passing decoder to decode all 32,400 bits and produce estimates of the corrected parity bits.

In particular, as discussed above, LDPC codes can be represented by bipartite graphs with bit nodes on one side and check nodes on the other with interconnections specifying the bit nodes that participate in a given check node's parity check equation. The well-known sum-product message passage algorithm may be used to decode the received signals using soft (multi-level) LLRs provided by the LLR calculator 410. The message passed from a bit to check node is the sum of the input LLR and all the check-to-bit node LLR messages, excluding the LLR for the outgoing edge given by the following equation:

$$v = u_0 + \sum_{i=1}^{d_v-1} u_i, \quad \text{Eq. 9}$$

where $d_v$, is the degree of the bit (variable) node being operated one. The message passed from check to bit nodes is calculated from a product of tan h functions of scaled check node input LLRs, excluding the input LLR for the output edge for which the message applies:

$$u = 2\tanh^{-1}\left(\prod_{j=1}^{d_c-1} \tanh\frac{v_j}{2}\right), \quad \text{Eq. 10}$$

where $d_c$ is the degree of the check node being operated one. The messages of Equations 9 and 10 can be quantized and clipped (limited).

The output of the LDPC decoder 414 is re-interleaved and re-combined into 2-bit groups by the bit-interleaver/grouper 416 to form 4050 2-bit LSBs per channel. The bit-interleaver/grouper 416 performs the same operation of the bit interleaver/grouper 108 in the encoder 100. The parity bit deletion module 418 processes the output of the LDPC decoder 414 to delete the parity bits and produce 27,000 information bits per frame. The QAM re-mapper 406 selects the un-coded MSBs from the 16,200 (I, Q) demodulator output values stored in the buffer 404 in accordance with the 16,200 2-bit LSBs produced by the bit-interleaver/grouper 416 on a channel-by-channel basis. For each symbol, this computation includes finding the ideal QAM constellation point having the decoded 2-bits as LSBs that is closest in Euclidean distance to the corresponding (I, Q) demodulator output stored in the buffer 404. The MSBs from the resultant ideal QAM points are selected as the un-coded bit pairs and, together with the information bits from the parity bit deletion module 418, are re-combined by the data re-combiner 408 to form the fully decoded data frame.

Figure 5:
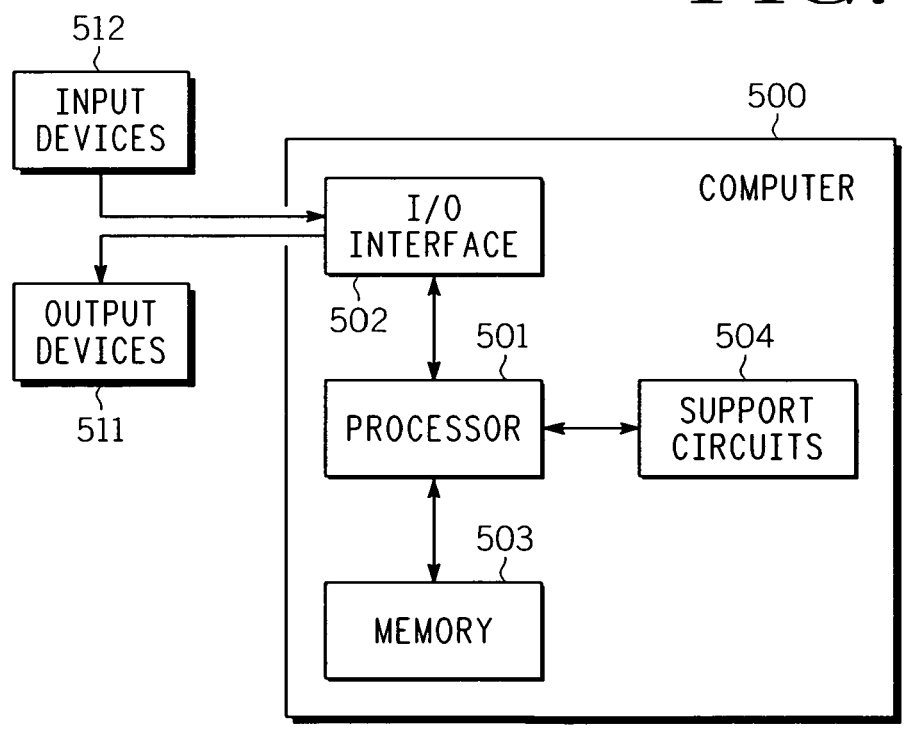
FIG. 5 is a block diagram depicting an exemplary embodiment of a computer suitable for implementing the processes and methods described herein.

FIG. 5 is a block diagram depicting an exemplary embodiment of a computer 500 suitable for implementing the processes and methods described herein. The computer 500 may be used to implement in software the encoder 100, encoding system 300, or the decoder 400. The computer 500 includes a processor 501, a memory 503, various support circuits 504, and an I/O interface 502. The processor 501 may be any type of microprocessor known in the art. The support circuits 504 for the processor 501 include conventional cache, power supplies, clock circuits, data registers, I/O interfaces, and the like. The I/O interface 502 may be directly coupled to the memory 503 or coupled through the processor 501. The I/O interface 502 may be coupled to various input devices 512 and output devices 511, such as a conventional keyboard, mouse, printer, display, and the like.

The memory 503 may store all or portions of one or more programs, program information, and/or data to implement the functions of the elements in the encoder 100, encoding system 300, or the decoder 400. Although the present embodiment is disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing is directed to illustrative embodiments of the present invention, other and further embodiments of the invention may be devised without departing from the basic scope thereof, and the scope thereof is determined by the claims that follow.

What is claimed is:

1. A method of encoding frames of content, comprising:
partitioning each frame into un-coded bits and bits to be encoded; and
for each frame:
applying a forward error correction (FEC) code to the bits to be encoded to generate a codeword;
dividing groups of encoded bits from the codeword and dividing a like number of groups of un-coded bits from the un-coded bits;
forming symbols, each symbol being formed from one of the groups of encoded bits and one of the groups of un-coded bits;
mapping the symbols to mapped constellation points; and
modulating each of a plurality of channels using all of the mapped constellation points in a round robin fashion before modulating any of the plurality of channels with a constellation point mapped from bits of a subsequent frame, wherein the round robin fashion simultaneously modulates each of the plurality of channels with different mapped constellation points, and wherein the simultaneous modulation is performed consecutively until all mapped constellation points are used once.

2. The method of claim 1, further comprising, for each frame:
interleaving bits in the codeword to generate an interleaved bit stream; and
obtaining the groups of bits from the interleaved bit stream.

3. The method of claim 1, wherein the FEC code comprises a low density parity check (LDPC) code.

4. The method of claim 3, wherein the LDPC code has a length N greater than or equal to 32,400 bits.

5. The method of claim 1, wherein the mapped constellation points are mapped from a constellation that comprises a quadrature amplitude modulation (QAM) constellation.

6. The method of claim 1, wherein the codeword includes information bits and parity bits, and wherein the information bits comprise two bits for each of the symbols, and wherein the un-coded bits comprise $\log_2(M)-2$ bits for each of the symbols, where M is a number of the points in the QAM constellation.

7. The method of claim 1, wherein each of the encoded groups of bits comprises two bits.

8. Apparatus for encoding frames of content, comprising:
a data parser for partitioning each frame into un-coded bits and bits to be encoded;
an encoder for applying a forward error correction (FEC) code to the bits to be encoded to generate a codeword for each frame;
a bit interleaver/grouper for dividing groups of bits from the codeword;
a mapper for mapping symbols formed from the groups of bits and a like number of groups of the un-coded bits to mapped constellation points that are mapped from a constellation; and
a modulator that modulates each of a plurality of channels, using the mapped constellation points for each frame in a round robin fashion before modulating any of the plurality of channels with a constellation point mapped from bits of a subsequent frame, wherein the round robin fashion simultaneously modulates each of the plurality of channels with different mapped constellation points, and wherein the simultaneous modulation is performed consecutively until all mapped constellation points are used once.

9. The apparatus of claim 8, wherein the bit interleaver/grouper is configured to interleave bits in the codeword to generate an interleaved bit stream and obtain the groups of bits from the interleaved bit stream for each frame.

10. The apparatus of claim 8, wherein the FEC code comprises a low density parity check (LDPC) code.

11. The apparatus of claim 10, wherein the LDPC code has a length N greater than or equal to 32,400 bits.

12. The apparatus of claim 8, wherein the mapped constellation points are mapped from a constellation that comprises a quadrature amplitude modulation (QAM) constellation.

13. The apparatus of claim 8, wherein the codeword includes information bits and parity bits, and wherein the information bits comprise two bits for each of the symbols, and wherein the un-coded bits comprise $\log_2(M)-2$ bits for each of the symbols, where M is a number of the points in the QAM constellation.

* * * * *